United States Patent
Swaminathan et al.

(10) Patent No.: US 9,934,859 B1
(45) Date of Patent: Apr. 3, 2018

(54) DETERMINING DEMARCATION VOLTAGE VIA TIMESTAMPS

(71) Applicant: INTEL CORPORATION, Santa Clara, CA (US)

(72) Inventors: Muthukumar P. Swaminathan, Folsom, CA (US); Zion S. Kwok, Vancouver (CA); Prashant S. Damle, Santa Clara, CA (US); Kunal A. Khochare, Folsom, CA (US); Philip Hillier, Rancho Santa Margarita, CA (US); Jeffrey W. Ryden, Tustin, CA (US); Richard P. Mangold, Forest Grove, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/391,763

(22) Filed: Dec. 27, 2016

(51) Int. Cl.
*G11C 16/10* (2006.01)
*G11C 16/26* (2006.01)

(52) U.S. Cl.
CPC .............. *G11C 16/10* (2013.01); *G11C 16/26* (2013.01)

(58) Field of Classification Search
CPC ................................. G11C 16/26; G11C 16/10
See application file for complete search history.

(56) References Cited

U.S. PATENT DOCUMENTS

2015/0332780 A1* 11/2015 Jang .................. G11C 7/04
365/185.18
2016/0004437 A1* 1/2016 Kim .................... G11C 29/021
714/764

OTHER PUBLICATIONS

U.S. Appl. No. 15/280,669, entitled "Determination of Demarcation Voltage for Managing Drift in Non-Volatile Memory Devices", invented by B. Querbach et al., filed Sep. 29, 2016, 34 pp.

* cited by examiner

*Primary Examiner* — Vanthu Nguyen
(74) *Attorney, Agent, or Firm* — Rabindranath Dutta; Konrad Raynes Davda & Victor LLP

(57) ABSTRACT

In response to a write operation on a storage element in a non-volatile memory device, a count provided by a global counter is stored to indicate a time at which the write operation occurs on the storage element. In response to receiving a request perform a read operation on the storage element, a determination is made of a demarcation voltage to apply for performing the read operation on the storage element, based on a progress of the global counter since the write operation on the storage element.

24 Claims, 9 Drawing Sheets

US 9,934,859 B1

DETERMINING DEMARCATION VOLTAGE VIA TIMESTAMPS

BACKGROUND

Volatile memory is a type of computer memory whose contents are erased when power to the volatile memory is turned off or interrupted. For example, dynamic random access memory (DRAM) is a type of volatile memory. Non-volatile memory is a type of computer memory that can retain stored information even after having been power cycled (i.e., turned off and then turned back on). In other words, non-volatile memory may store data persistently. Examples of non-volatile memory includes read-only memory (ROM), flash memory, etc.

A dual in-line memory module (DIMM) is a memory device that comprises a series of memory integrated circuits. Such modules may be mounted on a printed circuit board and may be designed for use in computational devices. A central processing unit (CPU) in a computational device may access the DIMM for performing read or write operations. DIMMs may be comprised of volatile or non-volatile memory integrated circuits.

A solid state drive (SSD) is a memory device that uses integrated circuit assemblies as memory to store data persistently. Many type of SSDs use non-volatile memory, such as NAND-based flash memory, where the NAND-based flash memory retains data after being power cycled.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Once data is written to a non-volatile memory device, the voltage that needs to be applied to the non-volatile memory device to correctly read the data may increase over time. If instead of determining the appropriate voltage that needs to be applied to correctly read the data, a static voltage is used, then incorrect data is likely to be read. The increase over time of the voltage to be applied to correctly read data is referred to as the drift of the voltage. The voltage that is suitable to read data correctly from the non-volatile memory device is referred to as a demarcation voltage (i.e., a read reference voltage). The demarcation voltage drifts over time after data is written to a non-volatile memory device. As a result of the drift, it is desirable to determine the correct demarcation voltage to apply for reading data.

A refresh is the process of periodically reading information from an area of memory and immediately rewriting the read information to the same area without modification, for the purpose of preserving the information. While periodic refreshes of the non-volatile memory cells of a non-volatile memory device may be performed to ensure to avoid problems caused by the drift of the demarcation voltage, such mechanisms are feasible only when the time between reads and writes is sufficiently high to perform the periodic refreshes without overloading the system. Certain embodiments provide a mechanism to determine the correct demarcation voltage for reading, without performing periodic refreshes of the non-volatile memory cells. Such embodiments may be applied in situations in which the time between a read and the last write on a non-volatile memory cell is not sufficiently high enough to incur the overhead of periodic refreshes of non-volatile memory cells. Multiple attempts to perform reads correctly are avoided by setting the demarcation voltage properly in a first attempt.

Certain embodiments provide a timestamp based solution, where the solution tracks the time elapsed since the last write, to determine the correct demarcation voltage for reading from a non-volatile memory cell. In such embodiments, the difference in time between a read and the last write on a non-volatile memory cell is used to determine the correct demarcation voltage to apply.

In certain embodiments, timestamps are stored for each addressable sub-block of a block. In certain other embodiments, the total number of bits needed to determine timestamps for each addressable sub-block of a block is reduced by storing one timestamp for the entire block, and for each of the sub-blocks storing time differences relative to the timestamp for the entire block.

Figure 1:
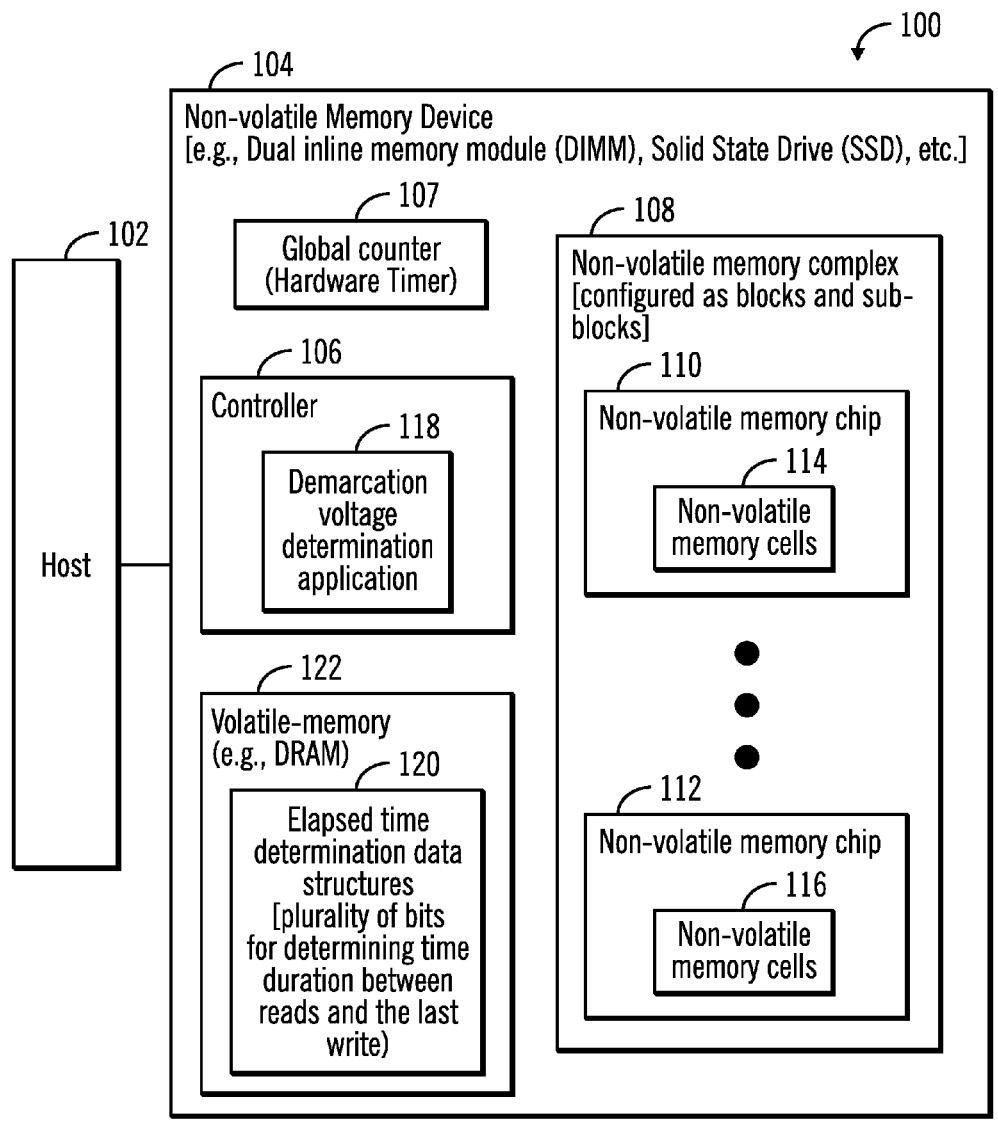
FIG. 1 illustrates a block diagram of a computing environment in which a host is coupled to a non-volatile memory device comprised of non-volatile memory, in accordance with certain embodiments.

FIG. 1 illustrates a block diagram of a computing environment 100 in which a host 102 writes data to a non-volatile memory device 104 and reads data from the non-volatile memory device 104, in accordance with certain embodiments. The non-volatile memory device 104 may be comprised of a controller 106, a global counter 107 comprising a hardware timer, and a non-volatile memory complex 108, where in certain embodiments the non-volatile memory complex 108 may be comprised of a plurality of non-volatile memory chips 110, 112 where each of the non-volatile memory chips 110, 112 may be comprised of a plurality of non-volatile memory cells 114, 116. The plurality of non-volatile memory cells 114, 116 of the non-volatile memory complex 108 may be configured as blocks where each block may be comprised of a plurality of sub-blocks.

In certain embodiments, the controller 106 may be implemented via an application-specific integrated circuit (ASIC). In certain embodiments, the controller 106 may include a demarcation voltage determination application 118 that is implemented in hardware, software, firmware or any combination thereof. The demarcation voltage determination application 118 determines the voltage to be applied to correctly read the data written to the non-volatile memory cells 114, 116. The non-volatile memory device 104 may also include elapsed time determination data structures 120 comprising a plurality of bits for determining the time duration between a read from a sub-block and the last write to the sub-block. Since the elapsed time determination data structures 120 may be stored in volatile memory 122 (e.g., Dynamic Random Access Memory (DRAM)) it may be desirable to minimize the number of bits needed for maintaining the elapsed time determination data structures 120.

In certain embodiments the global counter 107 is a hardware timer that counts in increments. For example, the global counter 107 may be an m-bit counter that starts counting from 0, in increments of 1, and after reaching the count of (2m−1) the global counter 107 is reset to 0. The global counter 107 is incremented at periodic intervals of time. For example, in certain embodiments the global counter 107 is incremented every t seconds, i.e., the timestamp granularity is t seconds for the global counter 107. Therefore, the global counter 107 runs continuously and timestamps may be derived from the global counter 107.

The demarcation voltage determination application 118 stores the time of the last write to a sub-block in the elapsed time determination data structures 120, by using the count provided by the global counter 107. At the time of a read, the demarcation voltage determination application 118 uses the time provided by the global counter 107 at the time of the read, and the last write time stored in the elapsed time determination data structures 120 to determine what demarcation voltage to use for the read.

In certain embodiments, the non-volatile memory device 104 may be a non-volatile memory DIMM that may in certain embodiments be comprised of non-volatile memory integrated circuits, where a non-volatile memory is a storage medium that does not require power to maintain the state of data stored by the storage medium. In certain embodiments the non-volatile memory DIMM may be comprised of a Triple Level Cell (TLC) NAND or any other type of NAND [e.g., Single Level Cell (SLC), Multi Level Cell (MLC), Quad Level Cell (QLC), etc.] or any other type of non-volatile memory. In other embodiments the non-volatile memory DIMM may be comprised of certain other types of non-volatile memory, such as NOR memory or some other suitable non-volatile memory. Nonlimiting examples of non-volatile memory may include any or a combination of: solid state memory [such as planar or three Dimensional (3D) NAND flash memory or NOR flash memory], storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), three dimensional (3D) crosspoint memory, ferroelectric transistor random access memory (Fe-TRAM) ovonic memory, magnetoresistive random access memory (MRAM) memory that incorporates memristor technology, or spin transfer torque (STT)-MRAM, a spintronic magnetic junction memory based device, nanowire memory, electrically erasable programmable read-only memory (EEPROM), other various types of non-volatile random access memories (RAMs), and magnetic storage memory, or a combination of any of the above, or other memory. In some embodiments, the 3D crosspoint memory may comprise a transistor-less stackable cross point architecture in which memory cells sit at the intersection of words lines and bit lines and are individually addressable and in which bit storage is based on a change in bulk resistance. In certain embodiments, a DIMM with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In certain embodiments, the non-volatile memory device 104 may be comprised of a solid state drive or any other type of device that includes non-volatile memory. It should be noted that a DIMM or a solid state drive are examples of the non-volatile memory device 104, and the non-volatile memory device 104 may be comprised of any type of non-volatile memory.

In certain embodiments, the host 102 may be comprised of any suitable computational device, such as a personal computer, a mainframe, a telephony device, a smart phone, a storage controller, a blade computer, a processor with memory, etc. While FIG. 1 shows the non-volatile memory device 104 to be located outside the host 102, in certain embodiments, the non-volatile memory device 104 may be included within the host. In certain embodiments, the host 102 may communicate with the non-volatile memory device 104 over a bus (such as a Peripheral Component Interconnect (PCIe), Serial Advanced Technology Attachment (SATA), Serial Attached Small Computer System Interface (SAS)), or a network, such as the Internet, a storage area network (SAN), a local area network (LAN), etc., or a logical device interface, such as NVM Express (NVMe).

Figure 2:
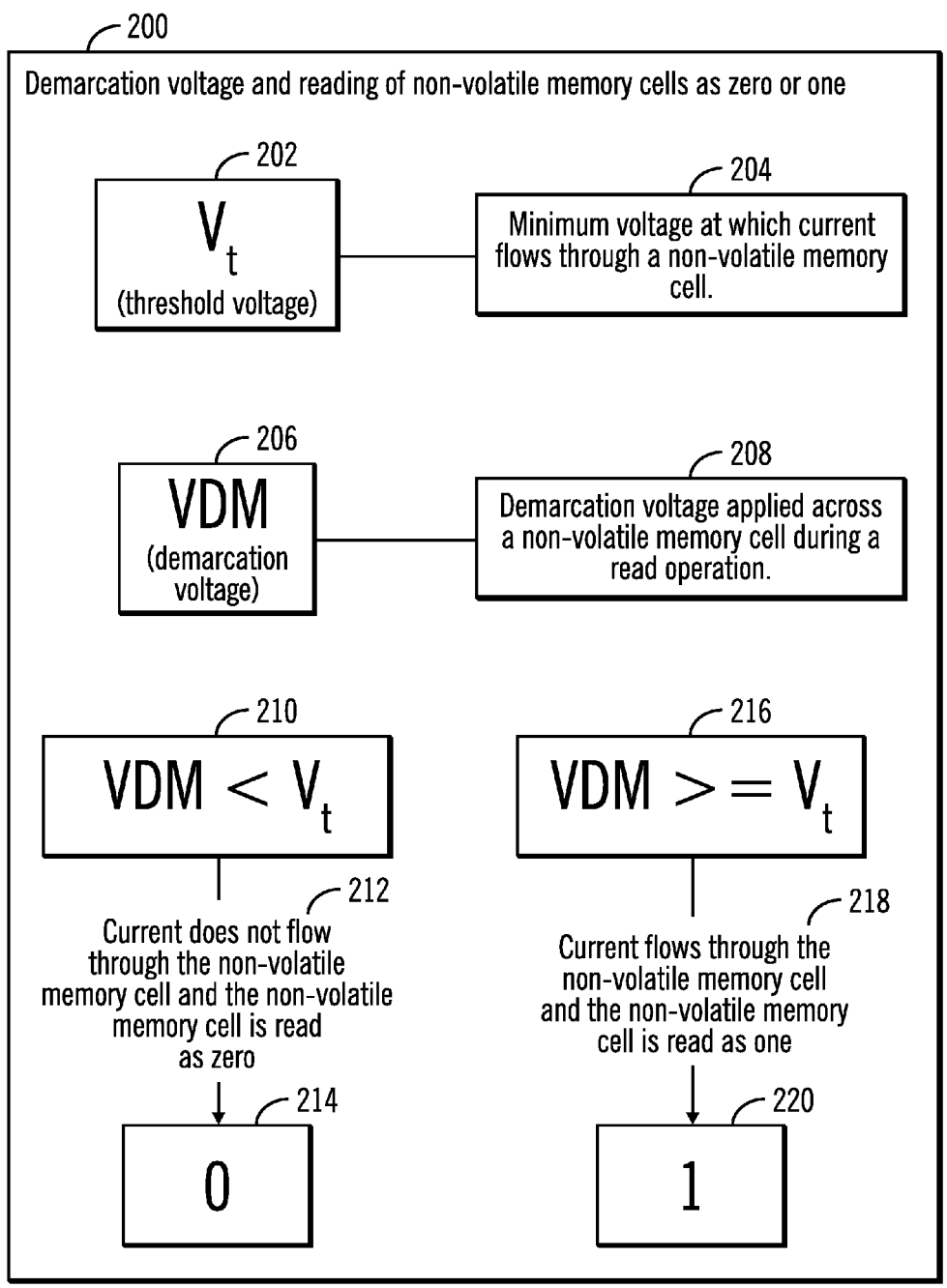
FIG. 2 illustrates a block diagram that shows how a demarcation voltage is applied to read data from a non-volatile memory cell, in accordance with certain embodiments.

FIG. 2 illustrates a block diagram 200 that shows how a demarcation voltage is applied to read data from a non-volatile memory cell, in accordance with certain embodiments. The demarcation voltage is defined to include any type of read reference voltage that is applied to read data from any type of non-volatile memory cell. 10017j In FIG. 2, $V_t$ 202 is a threshold voltage that denotes the minimum voltage at which current flows through a non-volatile memory cell (as shown via reference numeral 204). Voltage demarcation (VDM) 206 denotes the demarcation voltage, where the demarcation voltage is applied across a non-volatile memory cell during a read operation that reads data from the non-volatile memory cell (as shown via reference numeral 208).

Block 210 shows the condition in which the demarcation voltage applied to a non-volatile memory cell is less than the threshold voltage (i.e., $VDM<V_t$). In such a condition, current does not flow through the memory cell, and the non-volatile memory cell is read as zero (as shown via reference numerals 212, 214).

Block 216 shows the condition in which the demarcation voltage applied to a non-volatile memory cell is greater than or equal to the threshold voltage (i.e., $VDM>=V_t$). In such a condition, current flows through the memory cell, and the non-volatile memory cell is read as one (as shown via reference numerals 218, 220).

In alternative embodiments, when current flows through a non-volatile memory cell then the non-volatile memory cell is read as zero, and when current does not flow through a non-volatile memory cell then the non-volatile memory cell is read as one, where zero and one denote two different states of the non-volatile memory cell.

Figure 3:
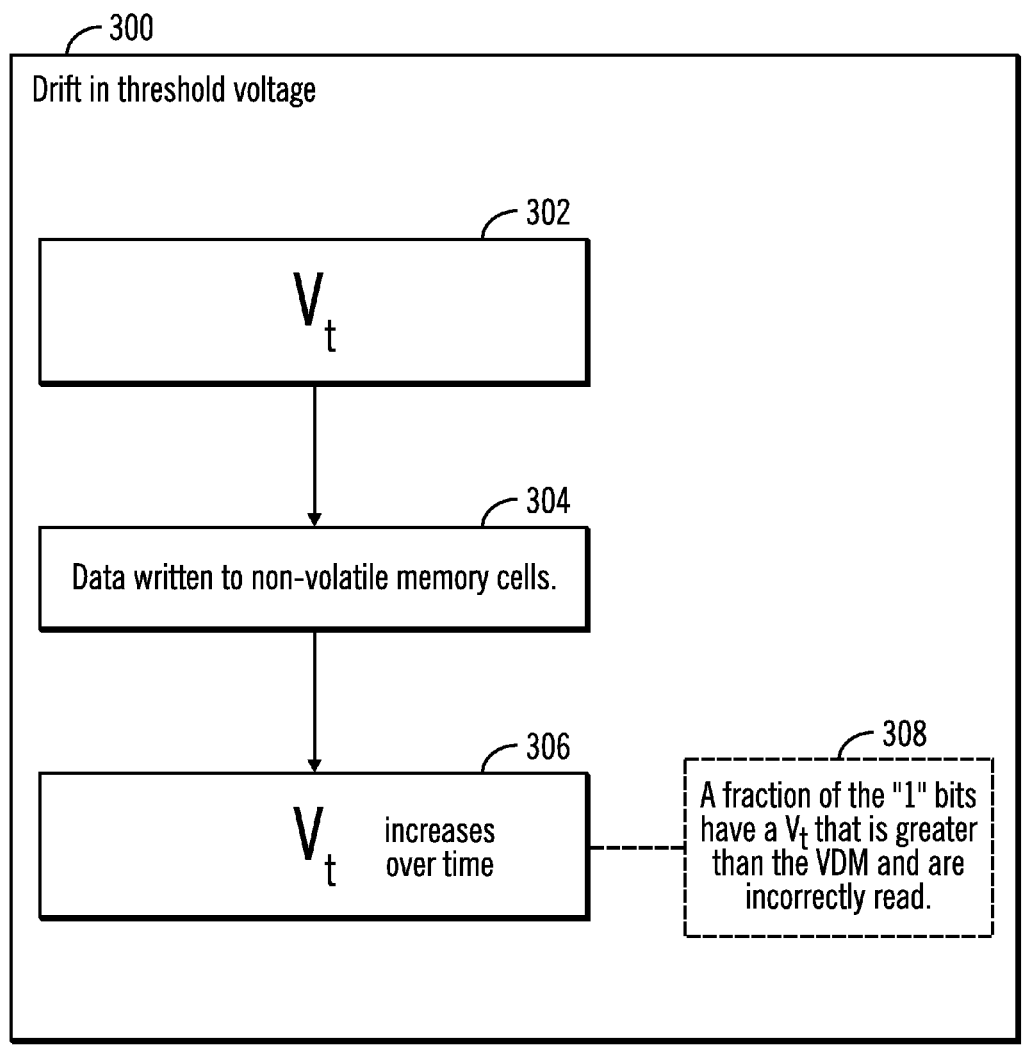
FIG. 3 illustrates a block diagram that shows how a threshold voltage increases over time for a non-volatile memory cell, in accordance with certain embodiments.

FIG. 3 illustrates a block diagram 300 that shows how a threshold voltage increases over time for a non-volatile memory cell, in accordance with certain embodiments. The increase over time of the threshold voltage is referred to as the drift of the threshold voltage.

Block 302 shows a plurality of memory cells whose threshold voltage is $V_t$, and data (i.e., zero or one) is written to each of the plurality of non-volatile memory cells (at block 304). After data is written to each of the plurality of non-volatile memory cells, the threshold voltage $V_t$ increases over time (as shown via reference numeral 306), where the increase in the threshold voltage may be different for different non-volatile memory cells. If the threshold voltage $V_t$ increases, then a fraction of the "1" bits of a plurality of non-volatile memory cells may have a $V_t$ that is greater than the demarcation voltage VDM, and these fraction of "1" bits are incorrectly read as zero when the demarcation voltage VDM is applied across the plurality of non-volatile memory cells.

Figure 4:
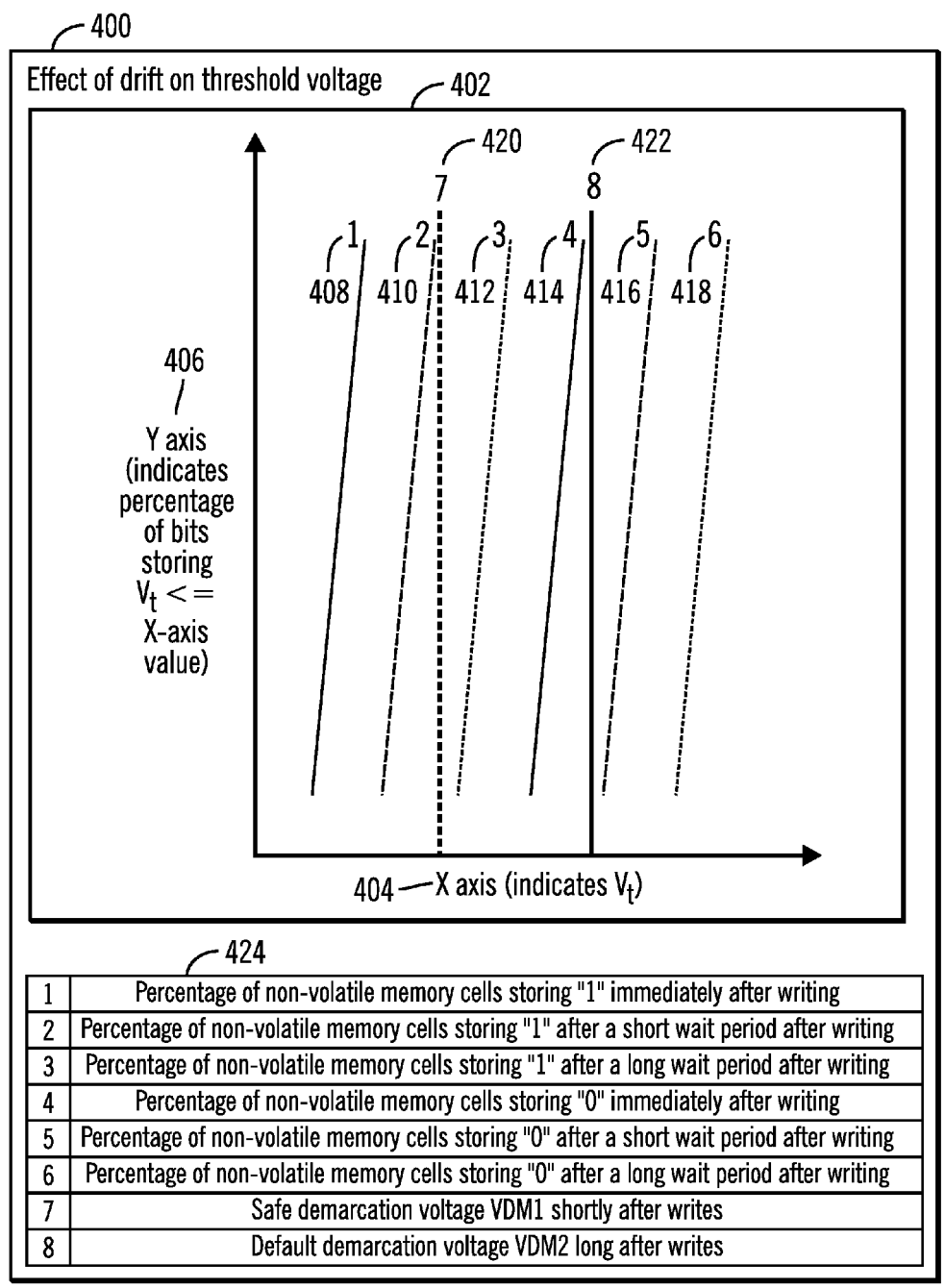
FIG. 4 illustrates a block diagram that shows the effect on drift on threshold voltage, in accordance with certain embodiments.

FIG. 4 illustrates a block diagram 400 that shows a graph 402 that shows the effect on drift on threshold voltage, in accordance with certain embodiments.

In FIG. 4, the X axis indicates the threshold voltage $V_t$ (reference numeral 404), and the Y axis indicates the percentage of bits in a plurality of non-volatile memory cells with the threshold voltage $V_t$ less than or equal to the X-axis value (reference numeral 406).

The lines labelled 1, 2, 3, 4, 5, 6, 7, 8 (shown via reference numerals 408, 410, 412, 414, 416. 418. 420, 422) that are shown in the graph 402 are described in the legend 424 shown in FIG. 4.

The line 1 (reference numeral 408) denotes the percentage of non-volatile memory cells with "1", immediately after writing to the non-volatile memory cells. The line 2 (reference numeral 410) denotes the percentage of non-volatile memory cells storing "1" after a short period has elapsed after writing to the non-volatile memory cells. The line 3 (reference numeral 412) denotes the percentage of non-volatile memory cells storing "1" after a long period has elapsed after writing to the non-volatile memory cells. The line 4 (reference numeral 414) denotes the percentage of non-volatile memory cells storing "0" immediately after writing to the non-volatile memory cells. The line 5 (reference numeral 416) denotes the percentage of non-volatile memory cells storing "0" after a short period has elapsed after writing to the non-volatile memory cells. The line 6 (reference numeral 418) denotes the percentage of non-volatile memory cells storing "0" after a long period has elapsed after writing to the non-volatile memory cells.

In the graph 402, line 7 (reference numeral 420) indicates a safe demarcation voltage VDM1 that should be used after a short period has elapsed after writing to the plurality of memory cells, as line 7 (shown via reference numeral 420) separates line 2 (reference numeral 410) and line 5 (reference numeral 416). If the controller 106 applies the safe demarcation voltage VDM1 to the plurality of non-volatile memory cells 114, 116 after the "short period" after writing, then data is read correctly from the plurality of non-volatile memory cells 114, 116.

In the graph 402, line 8 (reference numeral 422) indicates a safe demarcation voltage VDM2 that should be used after a long period has elapsed after writes to the plurality of memory cells, as line 8 (shown via reference numeral 422) separates line 3 (reference numeral 412) and line 6 (reference numeral 418). If the controller 106 applies the safe demarcation voltage VDM2 to the plurality of non-volatile memory cells 114, 116 after the "long period" after writing, then data is read correctly from the plurality of non-volatile memory cells 114, 116.

Therefore, FIG. 4 shows that demarcation voltage VDM2 that is used after a long period after writing to non-volatile memory cells is greater than the demarcation voltage VDM1 that is used after a short period after writing to non-volatile memory cells. In certain embodiments, VDM1 and VDM2 may be determined experimentally or via modeling and simulation of a non-volatile memory device, and may be stored in non-volatile memory at the time of manufacture of the non-volatile memory device. For example, in certain embodiments, VDM1 may be used as the demarcation voltage for a read when the time elapsed after the last write is less than a predetermined duration of time, and VDM2 may be used as the demarcation voltage for a read when the time elapsed after the last write is more than or equal to the predetermined duration of time.

Figure 5:
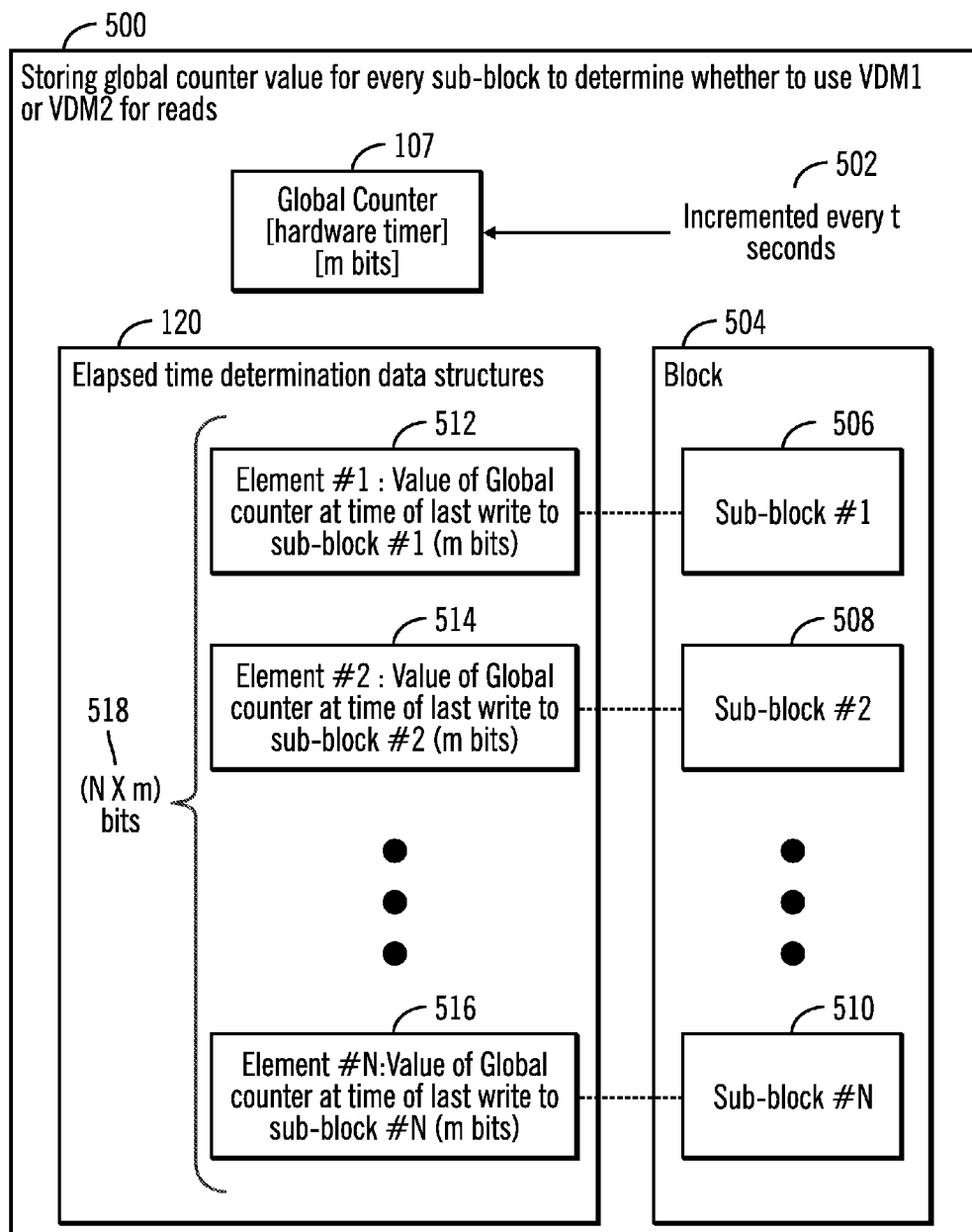
FIG. 5 illustrates a block diagram that shows storing a global counter value for each sub-block of a block, to determine which demarcation voltage to use for reading from a sub-block, in accordance with certain embodiments.

FIG. 5 illustrates a block diagram 500 that shows storing a global counter value for each sub-block of a block to determine which demarcation voltage to use, in accordance with certain embodiments. The operations that are shown via FIG. 5 may be performed by the demarcation voltage determination application 118 that executes in the controller 106 of the non-volatile memory device 104.

In certain embodiments, the global counter 107 is an m-bit counter that is incremented every t seconds (as shown via reference numeral 502). A block 504 of the non-volatile memory complex 108 may be comprised of a plurality of sub-blocks 506, 508, 516, where FIG. 5 shows N sub-blocks numbered from 1 to N.

In certain embodiments, for each sub-block of plurality of sub-blocks 506, 508, 510, the elapsed time determination data structures 120 may include an m-bit element to store the timestamp provided by the m-bit global counter 107 when a write is performed on the sub-block. Therefore, there are N elements 512, 514, 516 corresponding to each of the N sub-blocks 506, 508, 510, where each of the N elements 512, 514, 516 is comprised of m bits. The total number of bits used by the N elements 512, 514, 516 is (N×m) bits (as shown via reference numeral 518). Therefore, in the embodiments shown in FIG. 5 the elapsed time determination data structures 120 may be implemented by using (N×m) bits.

In certain embodiments, when a write is performed on a sub-block (e.g., sub-block 506), the demarcation voltage determination application 118 writes the count provided by the global counter 107 in the m-bit element (e.g., reference numeral 512) corresponding to the sub-block, to provide an indication of the time at which the sub-block was written to. Subsequently, at the time of a read on the sub-block (e.g., sub-block 506), the count of the global counter 107 at the time of the read and the count stored in the m-bit element (e.g., reference numeral 512) at the time of the last write is used to determine how much time has elapsed since the last write to the sub-block, and based on how much time has elapsed, either VDM1 or VDM2 is used as the demarcation voltage for performing the read.

In the embodiments shown in FIG. 5, for each sub-block, a plurality of bits that are equal in number to a number of bits of the global counter is maintained for storing the count provided by the global counter 107, to indicate the time at which the write operation occurs on the sub-block of the block. In certain embodiments, it may be desirable to reduce the total number of bits used for the elapsed time determination data structures 120.

Figure 6:
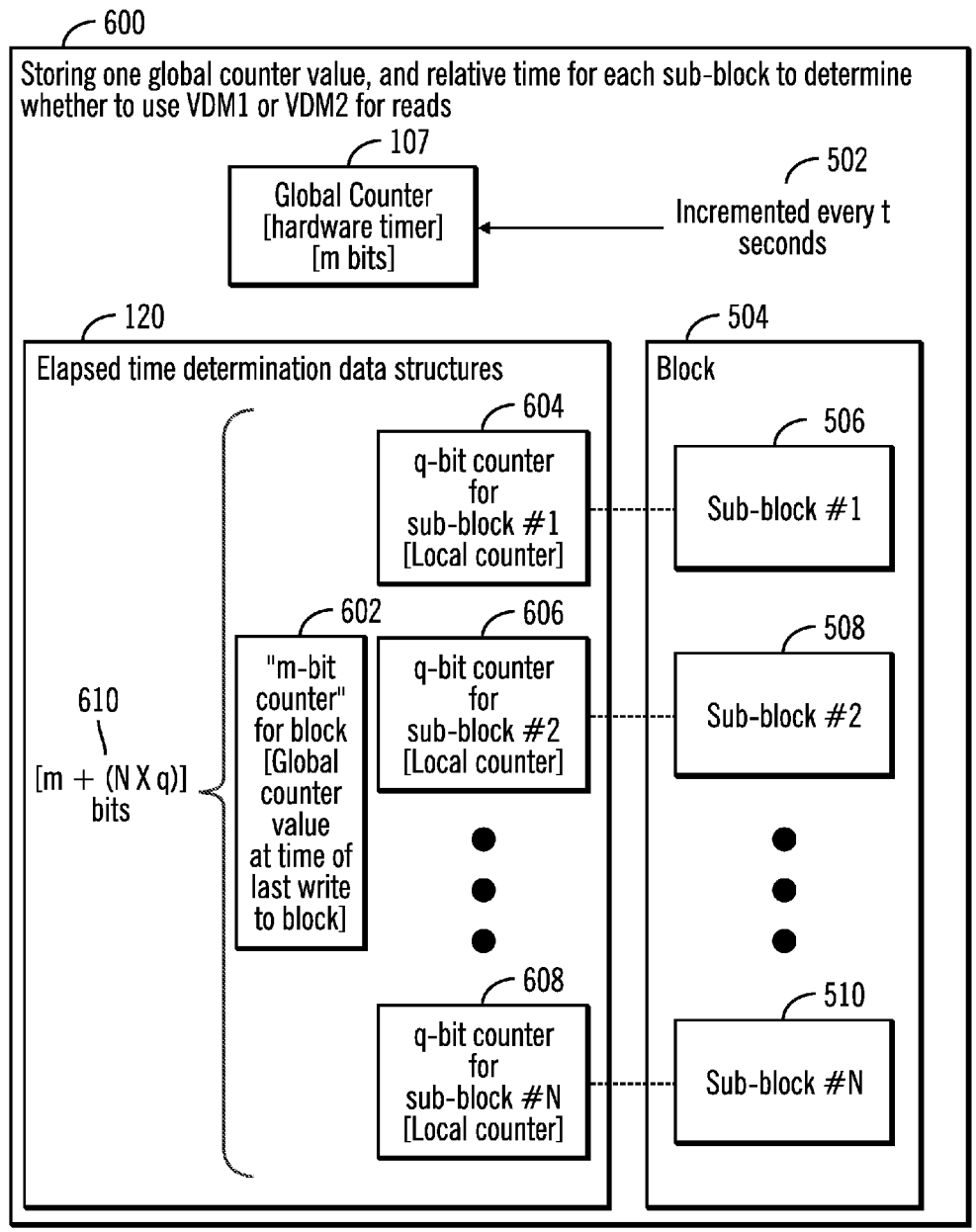
FIG. 6 illustrates a block diagram that shows storing a single global counter value for a block, and maintaining a relative counter for each sub-block of the block to determine which demarcation voltage to use for reading from a sub-block, in accordance with certain embodiments.

FIG. 6 illustrates a block diagram 600 that shows an m-bit element 602 (m-bit counter 602) for a block 504, and a q-bit element 604, 606, 608 (q-bit counter) for each of the N sub-blocks 506, 508, 510 of the block 504, where q is less than m, i.e., the size of each of the q-bit counters 604, 606, 608 is less than the size of the m-bit counter 602. The operations shown via FIG. 6 may be performed by the demarcation voltage determination application 118 that executes in the controller 106 of the non-volatile memory device 104.

If the global counter 107 is m bits in size, then the m-bit counter 602 may store the count provided the global counter 107 at the time of a write to any of the sub-blocks of the block 504. The q-bit counters 604, 606, 608 indicate time differences with respect to the m-bit counter 602.

In certain embodiments, the global counter 107 is incremented every t seconds. When a write occurs to a sub-block, both the m-bit counter 602 and the q-bit counter for the sub-block are updated. For example, when a write occurs to sub-block #2 508, then the m-bit counter 602 and the q-bit counter 606 are both updated. The q-bit counter 606 is smaller in size than the m-bit counter 602, and the q-bit counter 606 indicates time differences with respect to the m-bit counter 602. For example, in certain embodiments, when a write occurs to sub-block #2 508, then the q-bit counter 606 for sub-block #2 508 is reset to start counting from 0, while the single m-bit counter 602 is populated with the value of the m-bit global counter 107 to reflect the time at which the last write occurred in block 504, where block 504 includes the sub-block #2 508 and other sub-blocks.

The embodiments described in FIG. 6 allows the demarcation voltage determination application 118 to determine the time elapsed since the last write to a sub-block, to determine whether to use VDM1 or VDM2 as the demarcation voltage for the sub-block.

In FIG. 6 the total number of bits used by the elapsed time determination data structures 120 is [m+(N×q)] bits (reference numeral 610) as the single m-bit counter 602 and the N q-bit counters 604, 606, 608 together comprise [m+(N×q)] bits. In embodiments, the values of N, m, and n are such that [m+(N×q)] bits used for the elapsed time determination data structures 120 in FIG. 6 is less than the (N×m) bits used for the elapsed time determination data structures 120 in FIG. 5. For example, in certain embodiments, if m is 32, q is 16, and N is 16, then [m+(N×q)] is 288 which is less than (N×m) which is 512. Therefore, FIG. 6 shows an embodiment in which the number of bits used for the elapsed time determination data structures 120 is reduced to [m+(N×q)] bits in comparison to the (N×m) bits used for the elapsed time determination data structures 120 in FIG. 5.

The embodiments described in FIG. 6 allows the demarcation voltage determination application 118 to determine the demarcation voltage from reading from sub-blocks of a block with a fewer number of bits needed for the elapsed time determination data structures 120 in comparison to the embodiments described in FIG. 5.

Figure 7:
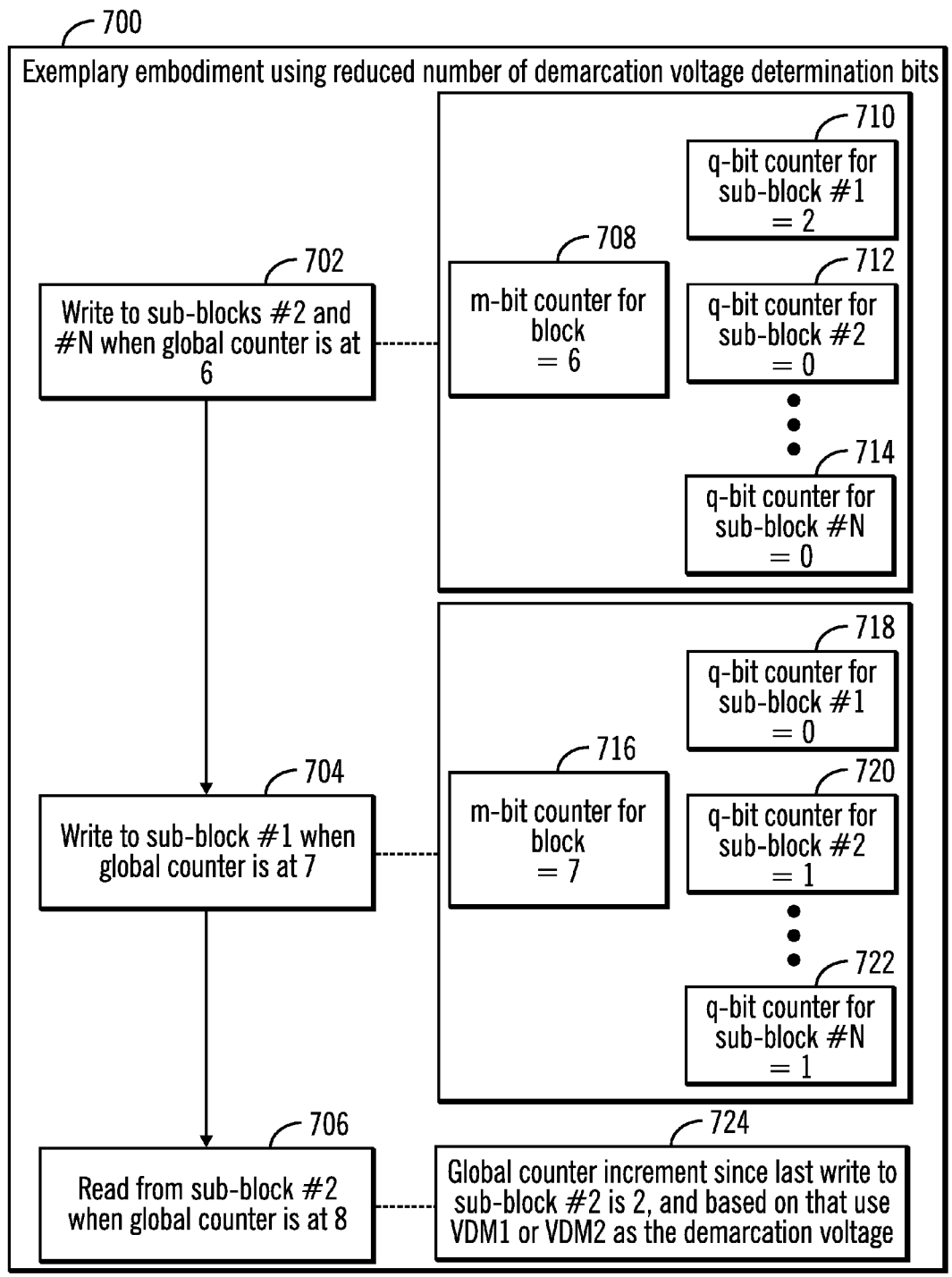
FIG. 7 illustrates a block diagram that shows exemplary global counter values for a block, and exemplary relative counter values for each sub-block of the block to determine which demarcation voltage to use for reading from a sub-block, in accordance with certain embodiments.

FIG. 7 illustrates a block diagram 700 that shows exemplary values for the m-bit counter for the block 504 and q-bit counters for the sub-blocks 506, 508, 510 to determine which demarcation voltage to use, in accordance with certain embodiments.

The operations that are shown being performed in FIG. 7 may be performed by the demarcation voltage determination application 118 that executes in the controller 106 of the non-volatile memory device 104.

Control starts at block 702 in which a write is performed to sub-blocks #2 and #N when the global counter 107 has the value of 6. The demarcation voltage determination application 118 sets the value of the m-bit counter to 6 (reference numeral 708), and resets the q-bit counters of sub-block #2 and sub-block #N to 0 (as shown via reference numeral 712, 714). The q-bit counter of sub-block #1 is shown to be 2 (reference numeral 710).

From block 702 control proceeds to block 704 in which a write is performed to sub-block #1 when the global counter 107 has the value of 7. The demarcation voltage determination application 118 sets the value of the m-bit counter to 7 (as shown via reference numeral 716), and resets the q-bit counter of sub-block #1 to 0 (reference numeral 718), and increments the q-bit counters of sub-block #2 and sub-block #N to 1 (reference numerals 720, 722).

From block 704 control proceeds to block 706 in which a read is to be performed from sub-block #2 when the global counter 107 has the value of 8. The demarcation voltage determination application 118 determines from the m-bit counter that the block was last written to at count 7 (reference numeral 716) but that sub-block #2 was written at a time that is 1 count before that (reference numeral 720). Therefore, sub-block #2 was last written at count 6. Since the read from sub-block #2 is being attempted at count 8, then 2 counts of time have elapsed since the last write to sub-block #2 and based on the elapsed time either VDM1 or VDM2 is used for reading from sub-block #2 (shown via reference numeral 724).

Therefore, FIGS. 6 and 7 shown certain embodiments in which the progress of the global counter 107 since the write operation on a sub-block is determined by maintaining for the block a plurality of bits (e.g., m-bit counter 602) that are equal in number to a number of bits of the global counter 107, and a local counter (e.g., q-bit counter 604, 606, 608) for each sub-block, where the number of bits of the local counter is less than the number of bits of the global counter 107. The local counter (e.g., q-bit counter 604, 606, 608) indicates a time difference relative to a count stored in the m-bit counter 602, wherein the local counter for a sub-block in combination with the m-bit counter indicates a time at which the write operation occurs on the sub-block.

Figure 8:
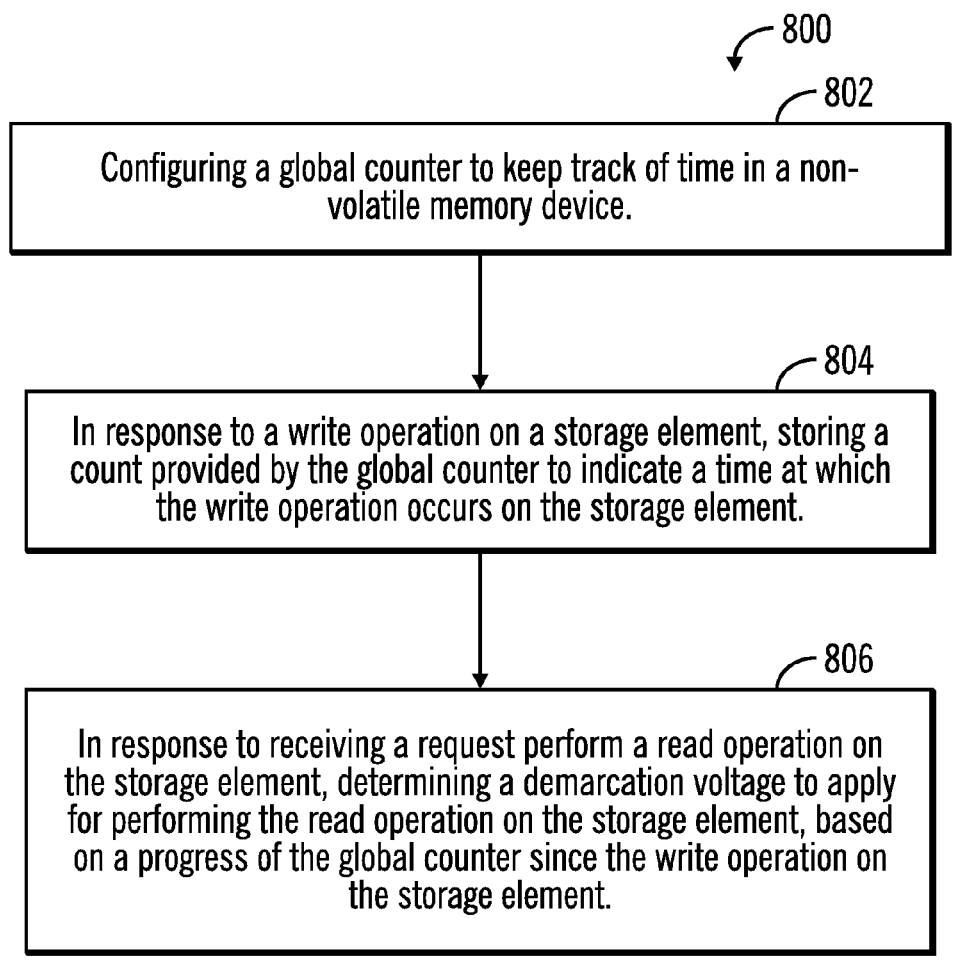
FIG. 8 illustrates a flowchart that operations for setting a demarcation voltage, in accordance with certain embodiments.

FIG. 8 illustrates a flowchart 800 that operations for setting a demarcation voltage, in accordance with certain embodiments. The operations that are shown being performed in FIG. 8 may be performed by the demarcation voltage determination application 118 that executes in the controller 106 of the non-volatile memory device 104.

Control starts with operations shown via reference numeral 802, in which a global counter 107 is configured to keep track of time in a non-volatile memory device 104. In response to a write operation on storage element (e.g., a block 504, a sub-block 506, 508, 510 of a block 504, an extent, a segment, or any other representation of storage) a count provided by the global counter 107 is stored to indicate a time at which the write operation occurs on the storage element (operations shown via reference numeral 604). In response to receiving a request perform a read operation on the storage element, a determination is made of a demarcation voltage to apply for performing the read operation on the storage element, based on a progress of the global counter 107 since the write operation on the storage element (operations shown via reference numeral 806). In certain embodiments, the storage element is a sub-block of a block. The storage element may comprise other representations of storage, such as a block, an extent, a segment, etc. In additional embodiments, the non-volatile memory device 104 is comprised of a plurality of non-volatile memory cells 114, 116 that comprise the block 504, where block 504 is comprised of a plurality of sub-blocks (e.g., sub-blocks 506, 508, 510), where each sub-block is separately addressable for reading or writing.

In operations shown in FIG. 8, in certain embodiments, the demarcation voltage is a first voltage (e.g., VDM1) if a time duration between the read operation on the sub-block and the write operation on the sub-block is relatively small, and the demarcation voltage is a second voltage (e.g., VDM2) that is greater than the first voltage if the time duration between the read operation on the sub-block and the write operation on the sub-block is relatively large.

Therefore, FIGS. 1-8 illustrate certain embodiments in which by determining the demarcation voltage for reading, the periodic refreshes of sub-blocks of the block of the non-volatile memory device may be performed at a reduced frequency, with longer intervals between each refresh. The demarcation voltage is determined on a first attempt by using different types of counters in different embodiments, for each sub-block of a block.

In certain variations of the embodiments, the location at which the elapsed time determination data structures 120 are kept may be different from a volatile memory comprising a DRAM, and based on the location the latency for accessing the timestamp may vary. While the embodiments have been described with two values for the demarcation voltage, in alternative embodiments there may be more than two values for the demarcation voltage, and the demarcation voltage may be selected from such values.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 9:
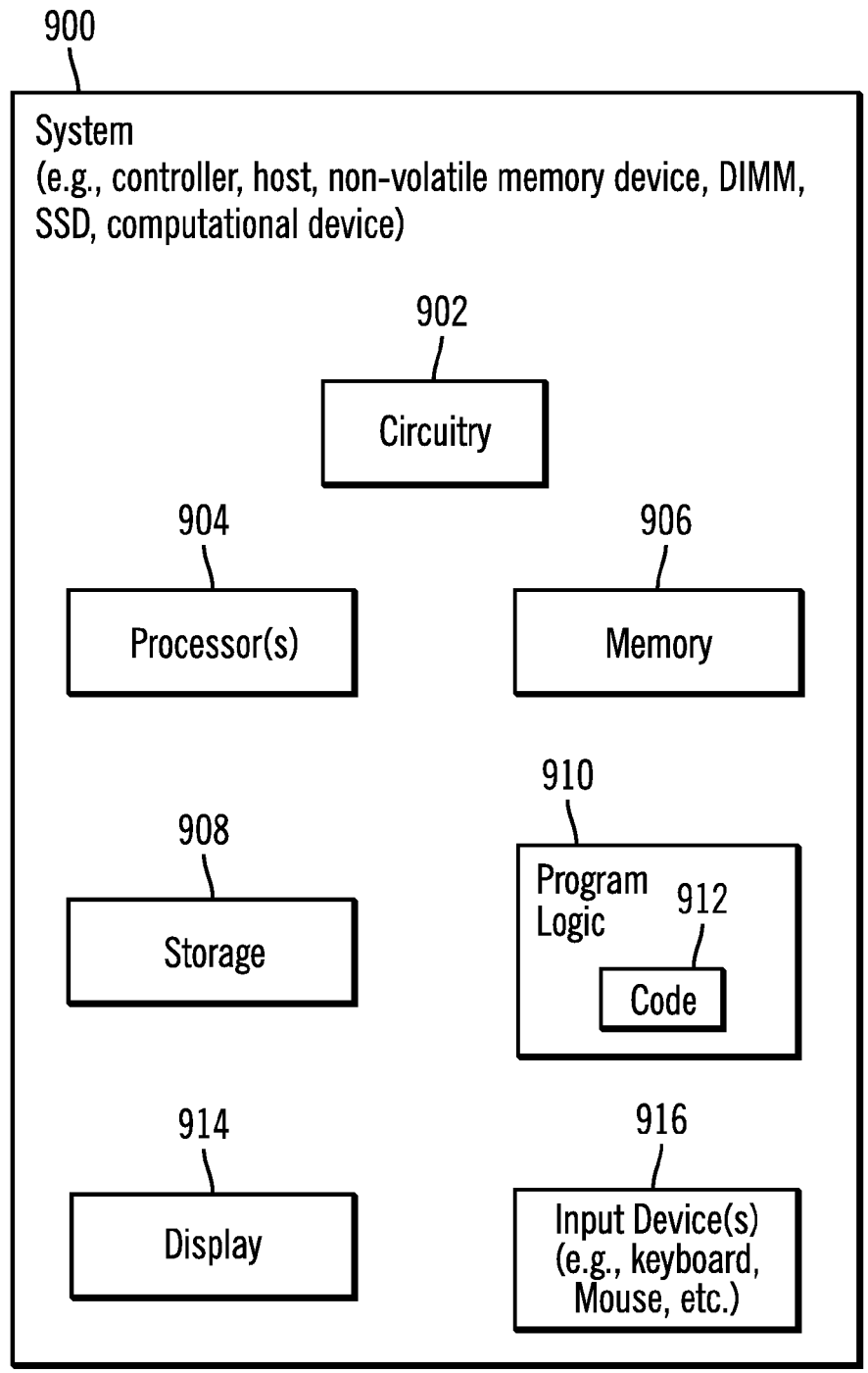
FIG. 9 illustrates a block diagram of a system comprising a controller, a host, a non-volatile memory device, a DIMM, an SSD, or a computational device, in accordance with certain embodiments.

FIG. 9 illustrates a block diagram of a system 900 that corresponds to the controller 106, the host 102, the non-volatile memory device 104, a DIMM, an SSD, or a computational device, in accordance with certain embodiments. For example, in certain embodiments the system 900 may be a computer (e.g., a laptop computer, a desktop computer, a tablet, a cell phone or any other suitable computational device) that has the host 102 and the non-volatile memory device 104 both included in the system 900. For example, in certain embodiments the system 900 may be a laptop computer that includes the non-volatile memory device 104. The system 900 may include a circuitry 902 that may in certain embodiments include at least a processor 904. The system 900 may also include a memory 906 (e.g., a volatile memory device), and storage 908. The storage 908 may include the non-volatile memory device 104 or other drives or devices including a non-volatile memory device (e.g., EEPROM, ROM, PROM, flash, firmware, programmable logic, etc.). The storage 908 may also include a magnetic disk drive, an optical disk drive, a tape drive, etc. The storage 908 may comprise an internal storage device, an attached storage device and/or a network accessible storage device. The system 900 may include a program logic 910 including code 912 that may be loaded into the memory 906 and executed by the processor 904 or circuitry 902. In certain embodiments, the program logic 910 including code 912 may be stored in the storage 908. In certain other embodiments, the program logic 910 may be implemented in the circuitry 902. Therefore, while FIG. 9 shows the program logic 910 separately from the other elements, the program logic 910 may be implemented in the memory 906 and/or the circuitry 902. The system 900 may also include a display 914 (e.g., an liquid crystal display (LCD), a light emitting diode (LED) display, a cathode ray tube (CRT) display, a touchscreen display, or any other suitable display). The system 900 may also include one or more input devices 916, such as, a keyboard, a mouse, a joystick, a trackpad, or any other suitable input devices. Other components or devices beyond those shown in FIG. 9 may also be found in the system 900.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments.

Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a method for memory access, in which in response to a write operation on a storage element in a non-volatile memory device, a count provided by a global counter is stored to indicate a time at which the write operation occurs on the storage element. In response to receiving a request perform a read operation on the storage element, a determination is made of a demarcation voltage to apply for performing the read operation on the storage element, based on a progress of the global counter since the write operation on the storage element.

In example 2, the subject matter of example 1 may include that the storage element is a sub-block of a block.

In example 3, the subject matter of example 2 may include that the non-volatile memory device is comprised of a plurality of non-volatile memory cells that comprise the block, and wherein the block is comprised of a plurality of sub-blocks, wherein each sub-block is separately addressable for reading or writing.

In example 4, the subject matter of example 2 may include that the demarcation voltage is a first voltage if a time duration between the read operation on the sub-block and the write operation on the sub-block is relatively small; and the demarcation voltage is a second voltage that is greater than the first voltage if the time duration between the read operation on the sub-block and the write operation on the sub-block is relatively large.

In example 5, the subject matter of example 2 may include that for each sub-block, a plurality of bits that are equal in number to a number of bits of the global counter is maintained for storing the count provided by the global counter to indicate the time at which the write operation occurs on the sub-block of the block.

In example 6, the subject matter of example 2 may include that the progress of the global counter since the write operation on the sub-block is determined by maintaining for the block a plurality of bits that are equal in number to a number of bits of the global counter, and a local counter for each sub-block, wherein the number of bits of the local counter is less than the number of bits of the global counter.

In example 7, the subject matter of example 6 may include that the local counter indicates a time difference relative to a count stored in the plurality of bits that are equal in number to a number of bits of the global counter.

In example 8, the subject matter of example 7 may include that the local counter for the sub-block in combination with the count stored in the plurality of bits indicates a time at which the write operation occurs on the sub-block.

Example 9 is a non-volatile memory device for memory access, the non-volatile memory device comprising: a non-volatile memory; and a controller coupled to the non-volatile memory, wherein the controller is operable to: in response to a write operation on a storage element, store a count provided by a global counter to indicate a time at which the write operation occurs on the storage element; and in response to receiving a request perform a read operation on the storage element, determine a demarcation voltage to apply for performing the read operation on the storage element, based on a progress of the global counter since the write operation on the storage element.

In example 10, the subject matter of example 9 may include that the storage element is a sub-block of a block.

In example 11, the subject matter of example 10 may include that the non-volatile memory device is comprised of a plurality of non-volatile memory cells that comprise the block, and wherein the block is comprised of a plurality of sub-blocks, wherein each sub-block is separately addressable for reading or writing.

In example 12, the subject matter of example 10 may include that the demarcation voltage is a first voltage if a time duration between the read operation on the sub-block and the write operation on the sub-block is relatively small; and the demarcation voltage is a second voltage that is greater than the first voltage if the time duration between the read operation on the sub-block and the write operation on the sub-block is relatively large.

In example 13, the subject matter of example 10 may include that for each sub-block, a plurality of bits that are equal in number to a number of bits of the global counter is maintained for storing the count provided by the global counter to indicate the time at which the write operation occurs on the sub-block of the block.

In example 14, the subject matter of example 10, may include that the progress of the global counter since the write operation on the sub-block is determined by maintaining for the block a plurality of bits that are equal in number to a number of bits of the global counter, and a local counter for each sub-block, wherein the number of bits of the local counter is less than the number of bits of the global counter.

In example 15, the subject matter of example 14 may include that the local counter indicates a time difference relative to a count stored in the plurality of bits that are equal in number to a number of bits of the global counter.

In example 16, the subject matter of example 15 may include that he local counter for the sub-block in combination with the count stored in the plurality of bits indicates a time at which the write operation occurs on the sub-block.

Example 17 is a system for memory access, the system comprising: comprising: a display; a non-volatile memory device comprised of a non-volatile memory; and a controller that controls the non-volatile memory, wherein the controller is operable to: in response to a write operation on a storage element, store a count provided by a global counter to indicate a time at which the write operation occurs on the storage element; and in response to receiving a request perform a read operation on the storage element, determine a demarcation voltage to apply for performing the read operation on the storage element, based on a progress of the global counter since the write operation on the storage element.

In example 18, the subject matter of example 17 may include that the storage element is a sub-block of a block.

In example 19, the subject matter of example 18 may include that the non-volatile memory device is comprised of a plurality of non-volatile memory cells that comprise the block, and wherein the block is comprised of a plurality of sub-blocks, wherein each sub-block is separately addressable for reading or writing.

In example 20, the subject matter of example 18 may include that the demarcation voltage is a first voltage if a time duration between the read operation on the sub-block and the write operation on the sub-block is relatively small; and the demarcation voltage is a second voltage that is greater than the first voltage if the time duration between the read operation on the sub-block and the write operation on the sub-block is relatively large.

In example 21, the subject matter of example 18 may include that for each sub-block, a plurality of bits that are equal in number to a number of bits of the global counter is maintained for storing the count provided by the global counter to indicate the time at which the write operation occurs on the sub-block of the block.

In example 22, the subject matter of example 18 may include that the progress of the global counter since the write operation on the sub-block is determined by maintaining for the block a plurality of bits that are equal in number to a number of bits of the global counter, and a local counter for each sub-block, wherein the number of bits of the local counter is less than the number of bits of the global counter.

In example 23, the subject matter of example 22 may include that the local counter indicates a time difference relative to a count stored in the plurality of bits that are equal in number to a number of bits of the global counter.

In example 24, the subject matter of example 23 may include that the local counter for the sub-block in combination with the count stored in the plurality of bits indicates a time at which the write operation occurs on the sub-block.

Example 25 is a system for memory access, the system comprising: means for storing a count provided by a global counter to indicate a time at which the write operation occurs on the storage element, in response to a write operation on a storage element in a non-volatile memory device, and means for determining a demarcation voltage to apply for performing the read operation on the storage element, based on a progress of the global counter since the write operation on the storage element, in response to receiving a request perform a read operation on the storage element.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:

1. A method comprising,
   in response to a write operation on a storage element in a non-volatile memory device, storing a time at which the write operation occurs on the storage element; and
   in response to receiving a request to perform a read operation on the storage element, determining a demarcation voltage to apply for performing the read operation on the storage element, wherein:
   the demarcation voltage is a first voltage if a time duration between the read operation on the storage element and the write operation on the storage element is relatively small; and
   the demarcation voltage is a second voltage that is greater than the first voltage if the time duration between the read operation on the storage element and the write operation on the storage element is relatively large.

2. The method of claim 1, wherein the storage element is a sub-block of a block.

3. The method of claim 2, wherein the non-volatile memory device is comprised of a plurality of non-volatile memory cells that comprise the block, wherein the block is comprised of a plurality of sub-blocks, and wherein each sub-block is separately addressable for reading or writing.

4. The method of claim 2, wherein the time at which the write operation occurs on the sub-block is indicated by storing a count provided by a global counter, and wherein the demarcation voltage to apply for performing the read operation on the storage element is based on a progress of the global counter since the write operation on the storage element.

5. The method of claim 2, wherein for each sub-block, a plurality of bits that are equal in number to a number of bits of a global counter is maintained for storing a count provided by the global counter to indicate the time at which the write operation occurs on the sub-block of the block.

6. A method comprising,
   in response to a write operation on a sub-block of a block in a non-volatile memory device, storing a count provided by a global counter to indicate a time at which the write operation occurs on the sub-block; and
   in response to receiving a request to perform a read operation on the sub-block, determining a demarcation voltage to apply for performing the read operation on the sub-block, based on a progress of the global counter since the write operation on the sub-block, wherein the progress of the global counter since the write operation on the sub-block is determined by maintaining for the block a plurality of bits that are equal in number to a number of bits of the global counter, and a local counter for each sub-block, and wherein the number of bits of the local counter is less than the number of bits of the global counter.

7. The method of claim 6, wherein the local counter indicates a time difference relative to a count stored in the plurality of bits that are equal in number to a number of bits of the global counter.

8. The method of claim 7, wherein the local counter for the sub-block in combination with the count stored in the plurality of bits indicates a time at which the write operation occurs on the sub-block.

9. A non-volatile memory device, comprising:
a non-volatile memory; and
a controller coupled to the non-volatile memory, wherein the controller is operable to:
  in response to a write operation on a storage element, store a time at which the write operation occurs on the storage element; and
  in response to receiving a request IQ perform a read operation on the storage element, determine a demarcation voltage to apply for performing the read operation on the storage element, wherein:
  the demarcation voltage is a first voltage if a time duration between the read operation on the storage element and the write operation on the storage element is relatively small; and
  the demarcation voltage is a second voltage that is greater than the first voltage if the time duration between the read operation on the storage element and the write operation on the storage element is relatively large.

10. The non-volatile memory device of claim 9, wherein the storage element is a sub-block of a block.

11. The non-volatile memory device of claim 10, wherein the non-volatile memory device is comprised of a plurality of non-volatile memory cells that comprise the block, wherein the block is comprised of a plurality of sub-blocks, and wherein each sub-block is separately addressable for reading or writing.

12. The non-volatile memory device of claim 10, wherein the time at which the write operation occurs on the sub-block is indicated by storing a count provided by a global counter, and wherein the demarcation voltage to apply for performing the read operation on the storage element is based on a progress of the global counter since the write operation on the storage element.

13. The non-volatile memory device of claim 10, wherein for each sub-block, a plurality of bits that are equal in number to a number of bits of a global counter is maintained for storing a count provided by the global counter to indicate the time at which the write operation occurs on the sub-block of the block.

14. A non-volatile memory device, comprising:
a non-volatile memory; and
a controller coupled to the non-volatile memory, wherein the controller is operable to:
  in response to a write operation on a sub-block of a block in a non-volatile memory device, store a count provided by a global counter to indicate a time at which the write operation occurs on the sub-block; and
  in response to receiving a request to perform a read operation on the sub-block, determine a demarcation voltage to apply for performing the read operation on the sub-block, based on a progress of the global counter since the write operation on the sub-block wherein the progress of the global counter since the write operation on the sub-block is determined by maintaining for the block a plurality of bits that are equal in number to a number of bits of the global counter, and a local counter for each sub-block, and wherein the number of bits of the local counter is less than the number of bits of the global counter.

15. The non-volatile memory device of claim 14, wherein the local counter indicates a time difference relative to a count stored in the plurality of bits that are equal in number to a number of bits of the global counter.

16. The non-volatile memory device of claim 15, wherein the local counter for the sub-block in combination with the count stored in the plurality of bits indicates a time at which the write operation occurs on the sub-block.

17. A system, comprising:
a display;
a non-volatile memory device comprised of a non-volatile memory; and
a controller that controls the non-volatile memory, wherein the controller is operable to:
  in response to a write operation on a storage element, store a time at which the write operation occurs on the storage element; and
  in response to receiving a request to perform a read operation on the storage element, determine a demarcation voltage to apply for performing the read operation on the storage element, wherein:
  the demarcation voltage is a first voltage if a time duration between the read operation on the storage element and the write operation on the storage element is relatively small; and
  the demarcation voltage is a second voltage that is greater than the first voltage if the time duration between the read operation on the storage element and the write operation on the storage element is relatively large.

18. The system of claim 17, wherein the storage element is a sub-block of a block.

19. The system of claim 18, wherein the non-volatile memory device is comprised of a plurality of non-volatile memory cells that comprise the block, wherein the block is comprised of a plurality of sub-blocks, and wherein each sub-block is separately addressable for reading or writing.

20. The system of claim 18, wherein the time at which the write operation occurs on the sub-block is indicated by storing a count provided by a global counter, and wherein the demarcation voltage to apply for performing the read operation on the storage element is based on a progress of the global counter since the write operation on the storage element.

21. The system of claim 18, wherein for each sub-block, a plurality of bits that are equal in number to a number of bits of a global counter is maintained for storing a count provided by the global counter to indicate the time at which the write operation occurs on the sub-block of the block.

22. A system, comprising:
a display;
a non-volatile memory device comprised of a non-volatile memory; and
a controller that controls the non-volatile memory, wherein the controller is operable to:
  in response to a write operation on a sub-block of a block in a non-volatile memory device, store a count provided by a global counter to indicate a time at which the write operation occurs on the sub-block; and
  in response to receiving a request to perform a read operation on the sub-block, determine a demarcation voltage to apply for performing the read operation on the sub-block, based on a progress of the global counter since the write operation on the sub-block, wherein the progress of the global counter since the write operation on the sub-block is determined by maintaining for the block a plurality of bits that are equal in number to a number of bits of the global counter, and a local counter for each sub-block, and wherein the number of bits of the local counter is less than the number of bits of the global counter.

23. The system of claim 22, wherein the local counter indicates a time difference relative to a count stored in the plurality of bits that are equal in number to a number of bits of the global counter.

24. The system of claim 23, wherein the local counter for the sub-block in combination with the count stored in the plurality of bits indicates a time at which the write operation occurs on the sub-block.

* * * * *